United States Patent
Furutani et al.

[11] Patent Number: 5,903,421
[45] Date of Patent: May 11, 1999

[54] HIGH-FREQUENCY COMPOSITE PART

[75] Inventors: Koji Furutani, Shiga-ken; Norio Nakajima, Takatsuki; Hidefumi Suzaki, Nagaokakyo, all of Japan

[73] Assignee: Murata Manufacturing Co., Ltd., Japan

[21] Appl. No.: 08/949,285

[22] Filed: Oct. 21, 1997

[30] Foreign Application Priority Data

Oct. 21, 1996 [JP] Japan ................... 8-278075

[51] Int. Cl.⁶ .............................. H02H 9/00; H02H 1/00
[52] U.S. Cl. ............................ 361/58; 361/113; 361/792
[58] Field of Search ..................... 379/387, 392; 455/3–7, 90, 83, 3.1; 333/104, 246, 247; 361/58, 113, 766, 780, 792, 793, 794, 795; 174/255, 252

[56] References Cited

U.S. PATENT DOCUMENTS

| | | | |
|---|---|---|---|
| 4,899,118 | 2/1990 | Polinski, Sr. ............................ | 333/246 |
| 5,034,709 | 7/1991 | Azumi et al. ........................... | 333/184 |
| 5,136,271 | 8/1992 | Nishioka et al. ....................... | 333/246 |
| 5,150,088 | 9/1992 | Virga et al. ............................ | 333/238 |
| 5,170,235 | 12/1992 | Tanino .................................... | 257/276 |
| 5,359,488 | 10/1994 | Leahy et al. ........................... | 361/707 |
| 5,387,888 | 2/1995 | Eda et al. ............................... | 333/247 |
| 5,406,235 | 4/1995 | Hayashi .................................. | 333/204 |
| 5,473,293 | 12/1995 | Chigodo et al. ....................... | 333/104 |
| 5,499,000 | 3/1996 | Morikawa et al. ..................... | 333/104 |

*Primary Examiner*—Nguyen Vo
*Assistant Examiner*—Charles N. Appiah
*Attorney, Agent, or Firm*—Ostrolenk, Faber, Gerb & Soffen, LLP

[57] ABSTRACT

A high-frequency composite part includes a high-frequency switch and an amplifier in a transmission circuit side among high-frequency parts constituting a PHS portable telephone. In the telephone, the high-frequency switch is used for switching between the connection of the transmission circuit Tx and an antenna, and the connection of a receiving circuit Rx and the antenna. The amplifier at the Tx side amplifies a signal to be transmitted which has been converted into an RF signal and passes through a filter at the Tx side, and sends it to the high-frequency switch. A high-frequency composite part may comprise: a multilayer board formed by laminating a plurality of dielectric layers; a high-frequency switch formed of a diode mounted on said multilayer board and a transmission line and a capacitor comprising interconnected electrodes formed on respective layers within said multilayer board; and an amplifier formed of a transistor mounted on said multilayer board and a transmission line and a capacitor comprising interconnected electrodes formed on respective layers within said multilayer board. In the high-frequency composite part, the amplifier may be comprised in a transmission circuit. The high-frequency composite part further may comprise a filter formed of a transmission line and a capacitor comprising interconnected electrodes formed on respective layers within said multilayer board. The multilayer board may comprise low-temperature baked ceramic material.

11 Claims, 9 Drawing Sheets

HIGH-FREQUENCY COMPOSITE PART

BACKGROUND OF THE INVENTION

1. Field of the Invention

The present invention relates to high-frequency composite parts used in a high-frequency circuit section of a portable telephone of a personal handy-phone system (PHS) type or a personal digital cellular (PDC) type.

2. Description of the Related Art

FIG. 10 and FIG. 11 are block diagrams of known PHS portable telephones. In a PHS portable telephone shown in FIG. 10, when transmitting, a signal to be transmitted is converted to an RF signal, passes through a filter F1 in a transmission circuit (Tx), is amplified by an amplifier AMP1 in the Tx side, passes through a high-frequency switch SW and a top filter F2, and is transmitted from an antenna ANT. On the other hand, when receiving, a signal is received from the antenna ANT, passes through the top filter F2, passes through the switch SW, and is amplified by an amplifier AMP2 in a receiving circuit (Rx). Then, signals in frequency bands other than that of the signal to be received are removed by a filter F3 in the Rx side.

In a PHS portable telephone shown in FIG. 11, when transmitting, a signal to be transmitted is converted to an RF signal, passes through a filter F1 in the Tx side, is amplified by an amplifier AMP1 in the Tx side, passes through a second filter F4 in the Tx side and a high-frequency switch SW, and is transmitted from an antenna ANT. On the other hand, when receiving, a signal received from the antenna ANT passes through the switch SW, and is amplified by an amplifier AMP2 in a receiving circuit (Rx). Then, signals in frequency bands other than that of the signal to be received are removed by a filter F3 in the Rx side.

These PHS portable telephones have been made compact and lightweight by highly dense mounting of compact, surface-mounting, high-frequency parts, such as the parts in FIGS. 10 and 11, on a printed circuit board.

It is expected that portable telephones will be made more compact and lightweight in the future while having more advanced functions. Therefore, high-frequency parts to be mounted on a board, such as those mentioned above, need to be made further compact and lightweight.

In a conventional portable telephone, however, since a discrete high-frequency switch and a discrete amplifier are mounted on a printed circuit board, it is difficult to make the telephone more compact and lightweight. Another restriction in the design phase of the conventional portable telephone is that characteristic-impedance matching is required for each of the high-frequency switch and the amplifier, which requires a matching circuit.

SUMMARY OF THE INVENTION

The present invention has been made to solve these problems. It is an object of the present invention to provide a high-frequency composite part which can be made more compact and lightweight by integrating a high-frequency switch and an amplifier.

The foregoing object is achieved according to one aspect of the present invention through the provision of a high-frequency composite part including: a multilayer board formed by laminating a plurality of dielectric layers; a high-frequency switch comprising a diode mounted on the multilayer board and a transmission line and a capacitor formed within the multilayer board; and an amplifier comprising a transistor mounted on the multilayer board and a transmission line and a capacitor formed within the multilayer board.

With such a high-frequency composite part, the transmission line and the capacitor used for the high-frequency switch and the transmission line and the capacitor used for the amplifier are formed within the multilayer board and the diode used for the high-frequency switch and the transistor used for the amplifier are mounted on the board, whereby the high-frequency switch and the amplifier are integrated within the multilayer board. Therefore, the area required for mounting the high-frequency switch and the amplifier on a printed circuit board is reduced, as compared with a case in which a conventional discrete high-frequency switch and amplifier are mounted and connected on a printed circuit board. The high-frequency composite part is made more compact and lightweight than conventional counterparts. Manufacturing cost is also reduced.

In addition, since the high-frequency switch and the amplifier can be designed at the same time, impedance matching between the high-frequency switch and the amplifier is implemented at the design stage, and thereby a matching circuit becomes unnecessary The amplifier may be an amplifier in the transmission circuit. Since the transmission line and the capacitor used for the high-frequency switch, and the transmission line and the capacitor used for the amplifier in the transmission side, are both formed within the multilayer board formed by laminating a plurality of dielectric layers; the diode used for the high-frequency switch and the transistor used for the amplifier are mounted on the board; and the high-frequency switch and the amplifier are both integrated in the multilayer board, the length of a line connecting the high-frequency switch to the amplifier in the transmission circuit is reduced, so a loss therein is also reduced. Therefore, a loss in the high-frequency composite part is also reduced.

Since the filter formed of a transmission line and a capacitor may be formed within the multilayer board, together with the high-frequency switch and the amplifier, the composite part is made further compact and lightweight than conventional counterparts. Cost is also further reduced.

A low-temperature baked ceramic board may be used as the multilayer board. In such a high-frequency composite part, because the multilayer board is made from low-temperature baked ceramic, a plurality of dielectric layers can be baked integrally with electrodes for forming a transmission line and a capacitor on the plurality of dielectric layers. Therefore, a manufacturing process can be simplified and cost can also be reduced.

According to a further aspect of a high-frequency composite part of the present invention, since a high-frequency switch and an amplifier are formed on a multilayer board made by laminating a plurality of dielectric layers and are integrated, the overall dimensions are made smaller than those of a conventional part in which a filter and an amplifier are mounted and connected on a printed circuit board. In addition, since the high-frequency switch and the amplifier can be designed at the same time, impedance matching between the high-frequency switch and the amplifier is implemented in the design stage.

DESCRIPTION OF EMBODIMENTS OF THE INVENTION

Figure 1:
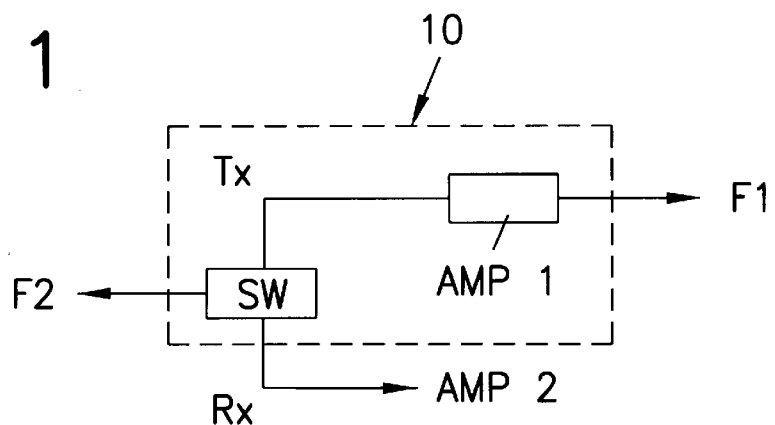
FIG. 1 is a block diagram of a high-frequency composite part according to a first embodiment of the present invention.
Figure 10:
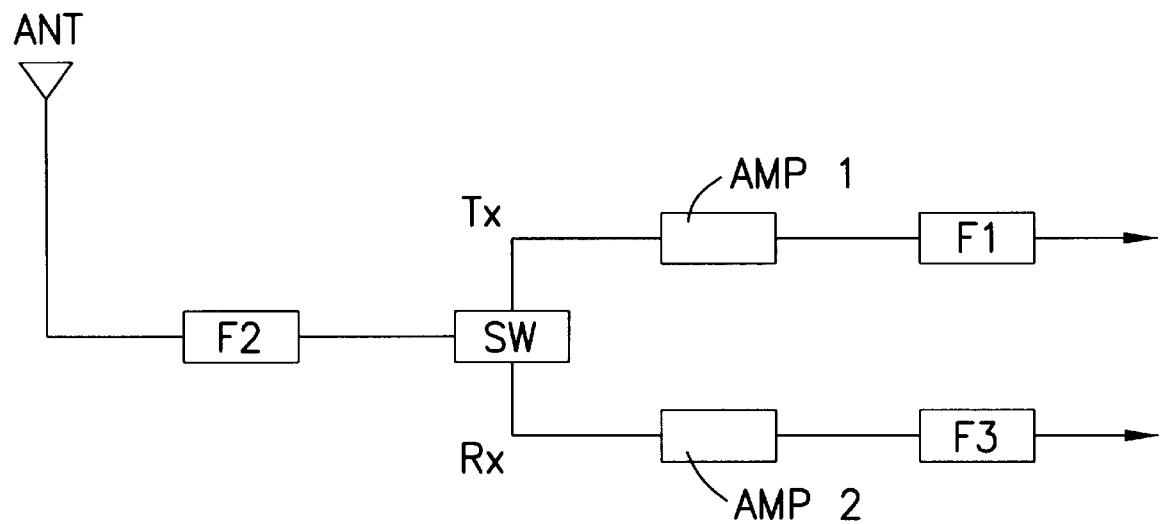
FIG. 10 is a block diagram of a known PHS portable telephone

Embodiments of the present invention will be described below by referring to the drawings FIG. 1 is a block diagram of a high-frequency composite part according to a first embodiment of the present invention A high-frequency composite part 10 includes a high-frequency switch SW and an amplifier AMP1 in a transmission (Tx) side among the high-frequency parts constituting a PHS portable telephone shown in FIG. 10.

The high-frequency switch SW is used for switching between a state in which it connects the transmitting circuit Tx and an antenna ANT and a state in which it connects a receiving circuit Rx and the antenna ANT in a PHS portable telephone The amplifier AMP1 at the Tx side amplifies a signal to be transmitted which has been converted into an RF signal (not shown) and passes through a filter F1 at the Tx side and then is sent to the high-frequency switch SW.

Figure 2:
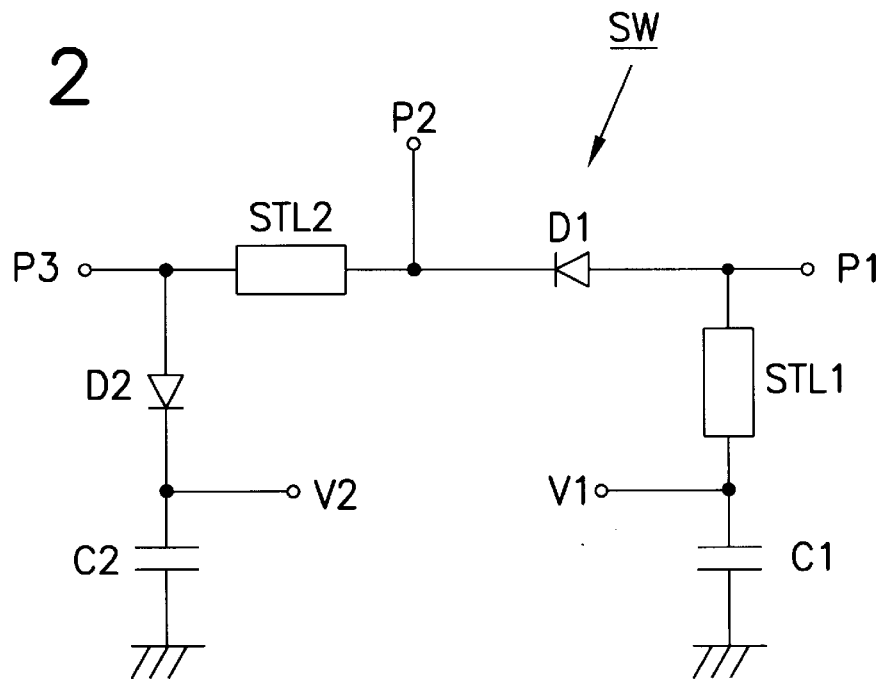
FIG. 2 is a circuit diagram of a high-frequency switch used in the high-frequency composite part shown in FIG. 1.

FIG. 2 is a circuit diagram of the high-frequency switch of the high-frequency composite part shown in FIG. 1. A first port P1 of the high-frequency switch SW connected to the amplifier AMP1 at the Tx side is connected to the anode of a diode D1. The anode of the diode D1 is grounded through a transmission line STL1 and a capacitor C1. The connection point between the transmission line STL1 and the capacitor C1 is connected to a control terminal V1. The cathode of the diode D1 is connected to a second port P2, to which the antenna ANT is connected.

The second port P2 is connected to one end of a transmission line STL2. The other end of the transmission line STL2 is connected to a third port P3, to which an amplifier AMP2 at the Rx side is connected. The other end of the transmission line STL2 is also connected to the anode of a diode D2. The cathode of the diode D2 is grounded through a capacitor C2. The connection point between the diode D2 and the capacitor C2 is connected to a control terminal V2.

Figure 3:
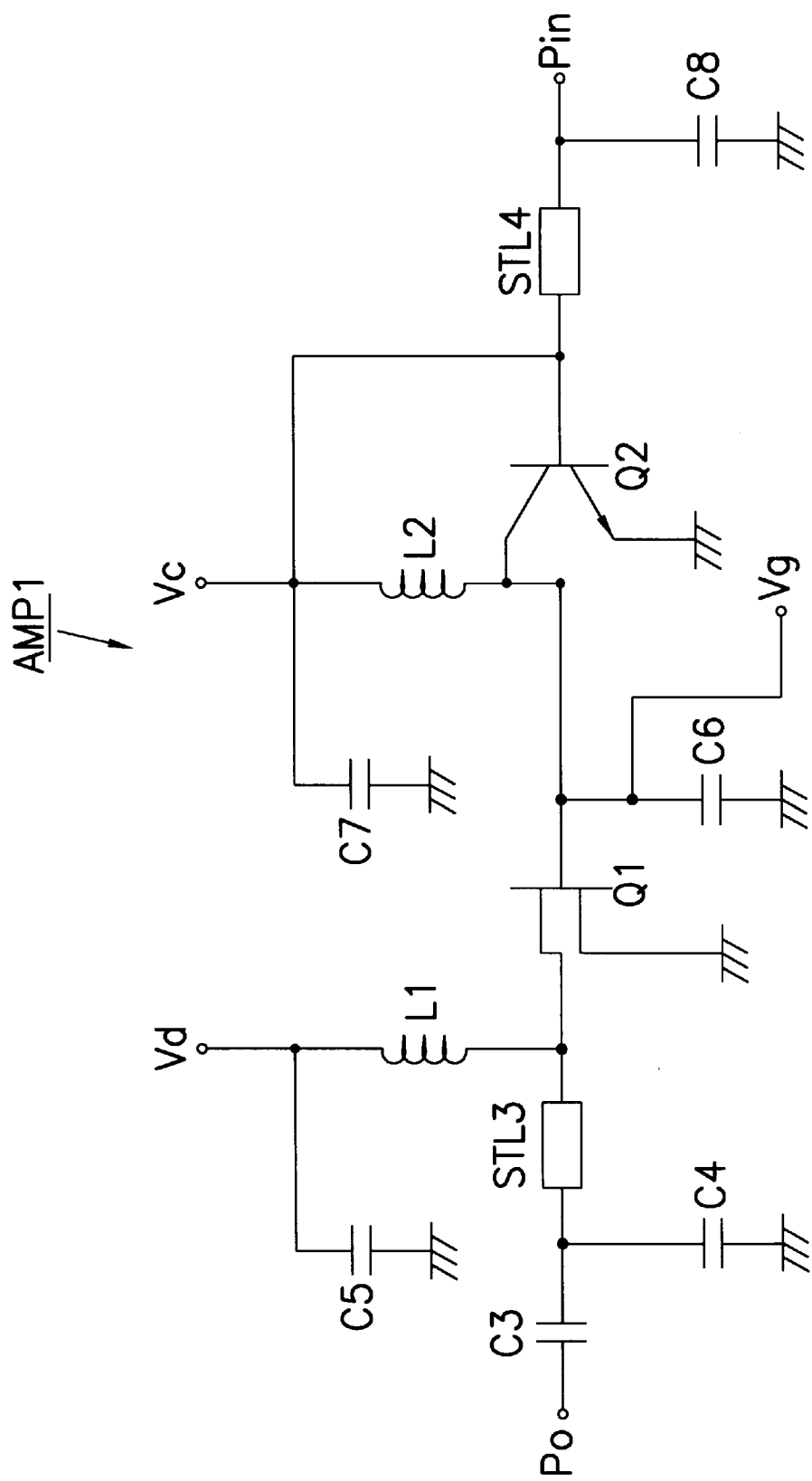
FIG. 3 is a circuit diagram of an amplifier used in the high-frequency composite part shown in FIG. 1.
Figure 4A:
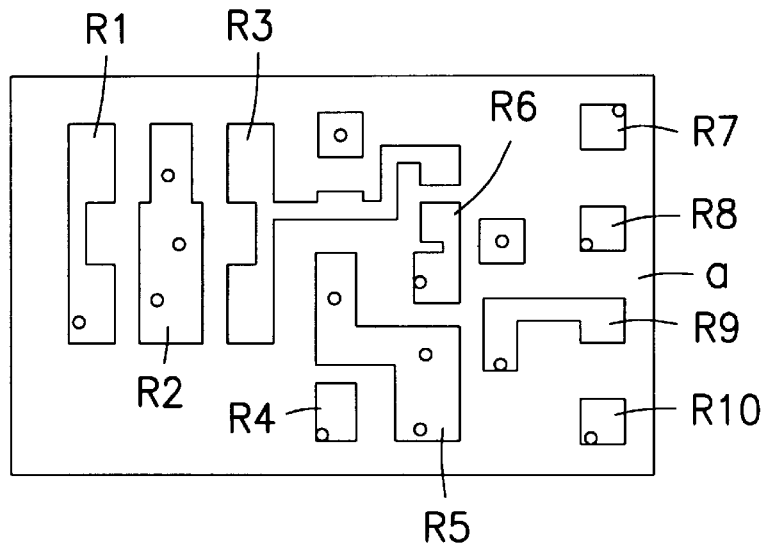
FIGS. 4A to 4H are top views of a first dielectric layer (a) to an eighth dielectric layer (h) used for the high-frequency composite part shown in FIG. 1.
Figure 4B:
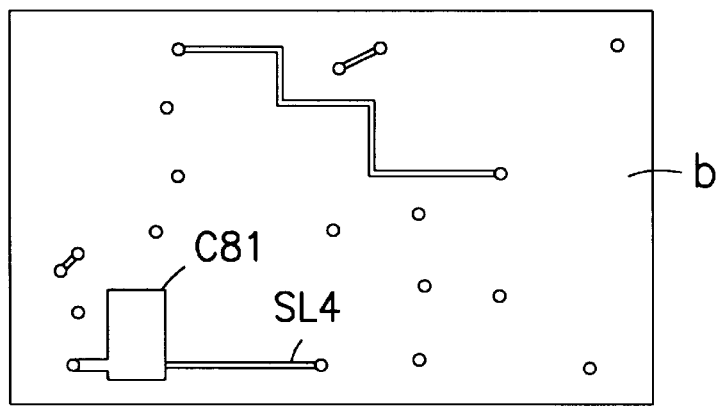
Figure 4C:
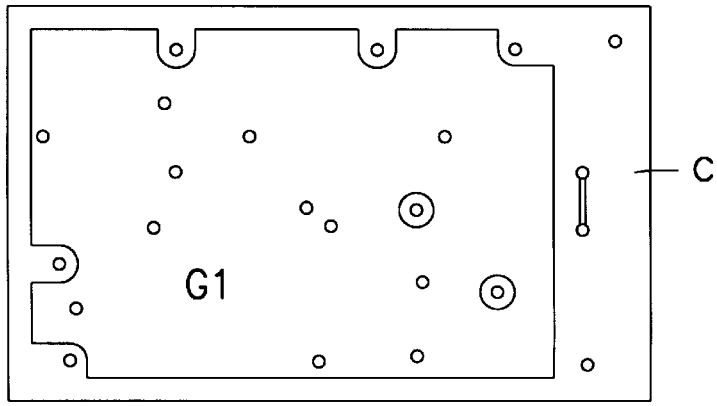
Figure 4D:
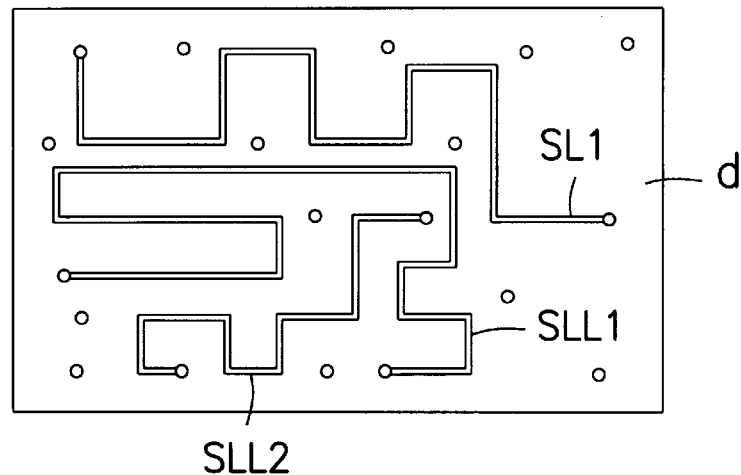
Figure 4E:
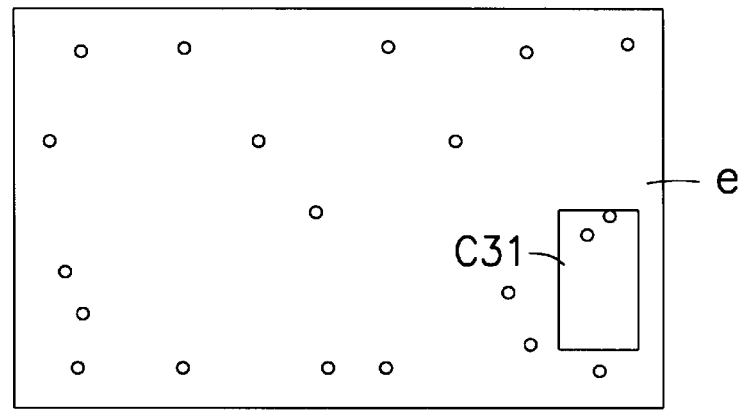
Figure 4F:
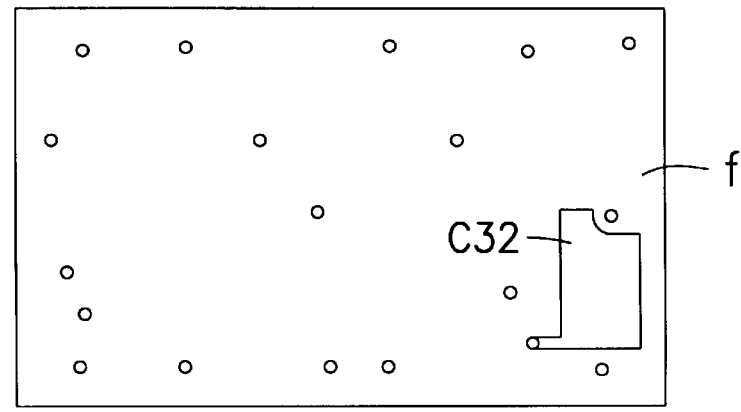
Figure 4G:
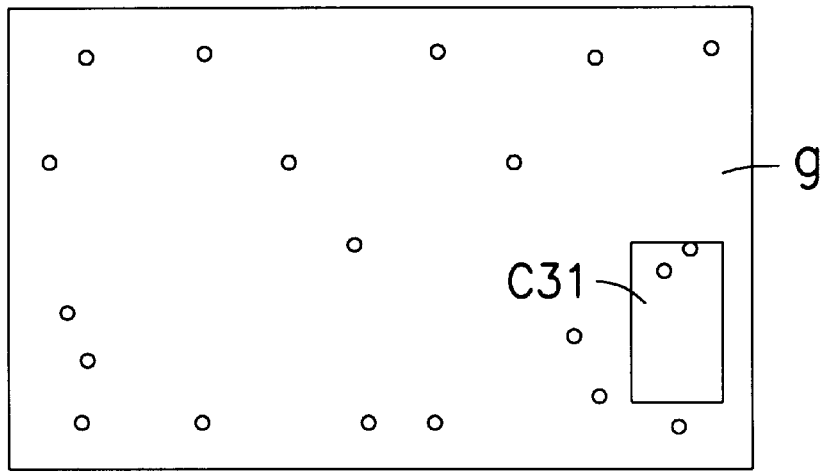
Figure 4H:
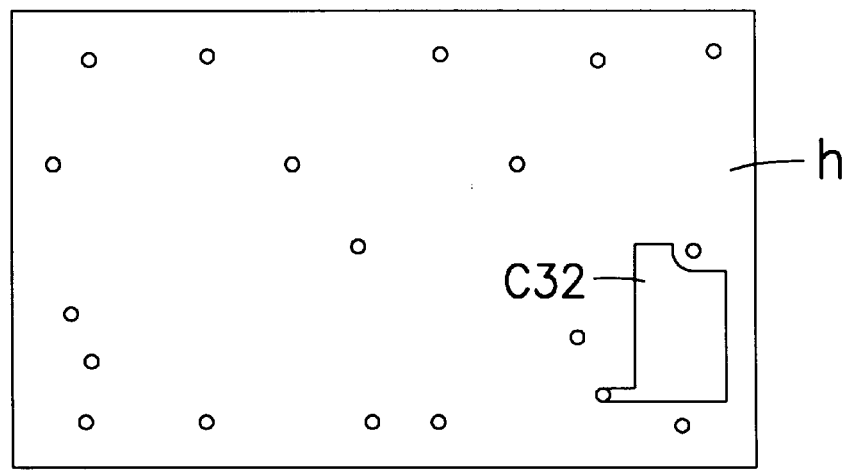

FIG. 3 is a circuit diagram of the amplifier at the Tx side of the high-frequency composite part shown in FIG. 1. The output port P, of the amplifier AMP1 at the Tx side to be connected to the first port P1 of the high-frequency switch SW is connected to one end of a transmission line STL3 through a capacitor C3. The connection point between the end of the transmission line STL3 and the capacitor C3 is grounded through a capacitor C4. The other end of the transmission line STL3 is connected to the drain of a field effect transistor (hereinafter called FET) Q1. The source of FET Q1 is grounded and the gate is connected to the collector of a bipolar transistor (hereinafter called B-Tr) Q2.

The connection point between the other end of the transmission line STL3 and the drain of FET Q1 is grounded through a series circuit formed of an inductor L1 made of a stripline and a capacitor C5. The connection point between the inductor L1 and the capacitor C5 is connected to a drain voltage terminal Vd. The connection point between the gate of FET Q1 and the collector of B-Tr Q2 is grounded through a capacitor C6 and is also connected to a gate voltage terminal Vg.

The emitter of B-Tr Q2 is grounded and the base is connected to one end of a transmission line STL4. The other end of the transmission line STL4 is connected to an input port Pin to which the filter F1 at the Tx side is connected.

The collector of B-Tr Q2 is grounded through a series circuit formed of an inductor L2 made of a stripline and a capacitor C7. The connection point between the inductor L2 and the capacitor C7 is connected to a collector voltage terminal Vc. The connection point between the inductor L2 and the capacitor C7 is also connected to the connection point between the base of B-Tr Q2 and one end of the transmission line STL4. The other end of the transmission line STL4 is grounded through a capacitor C8.

Figure 5A:
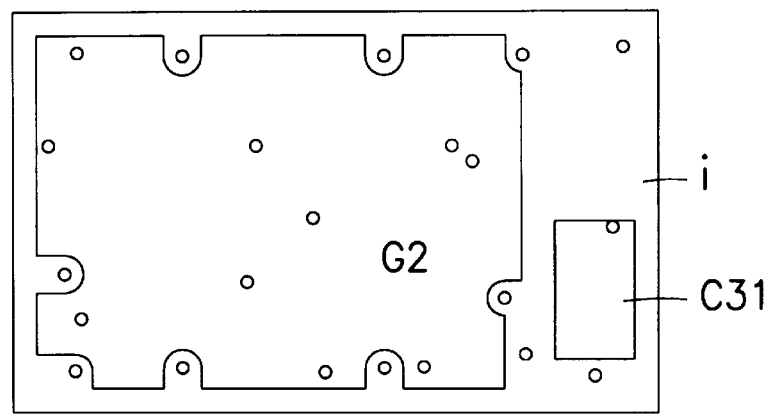
FIGS. 5A to 5F are top views of a ninth dielectric layer (a) to a thirteenth dielectric layer (e) and a bottom view of the thirteenth dielectric layer (f) used for the high-frequency composite part shown in FIG. 1.
Figure 5B:
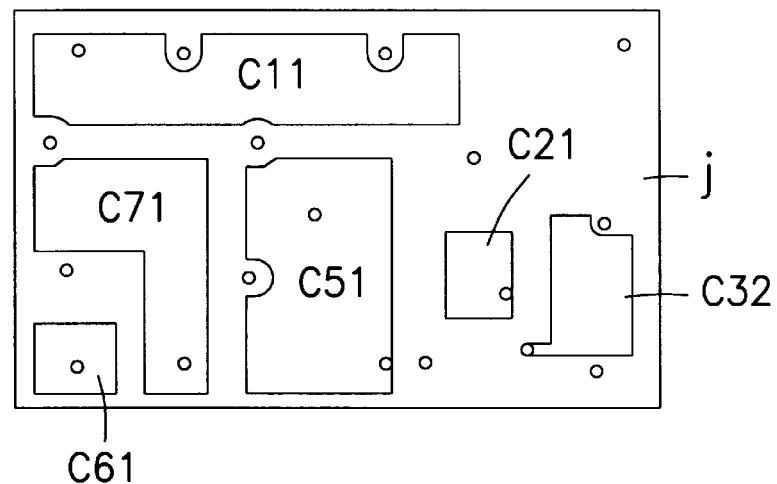
Figure 5C:
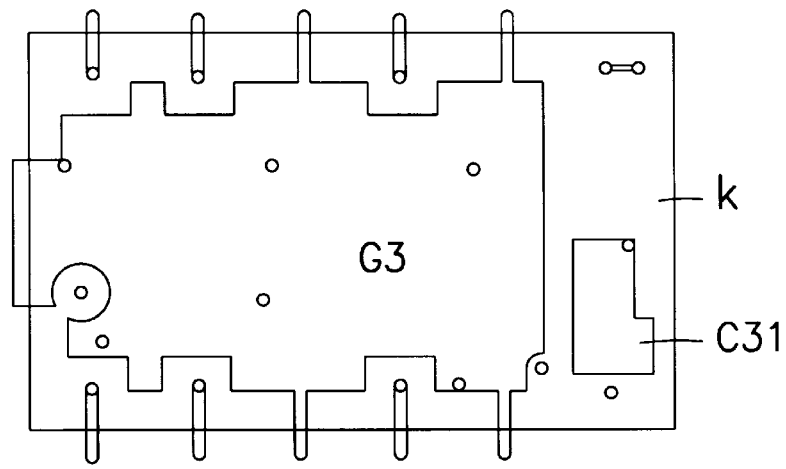
Figure 5D:
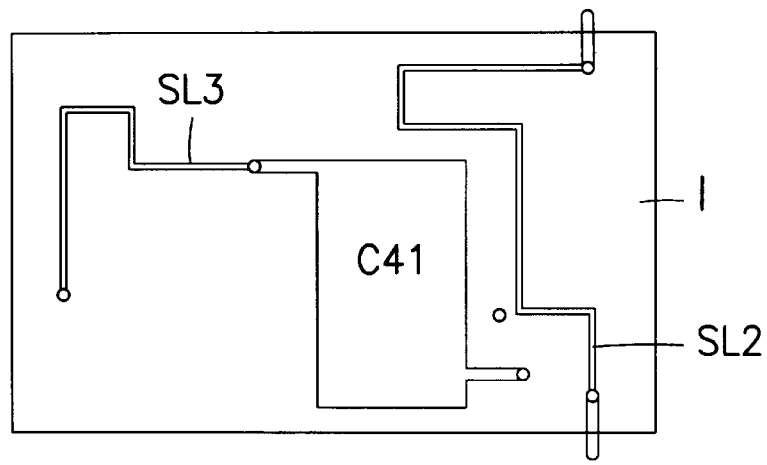
Figure 5E:
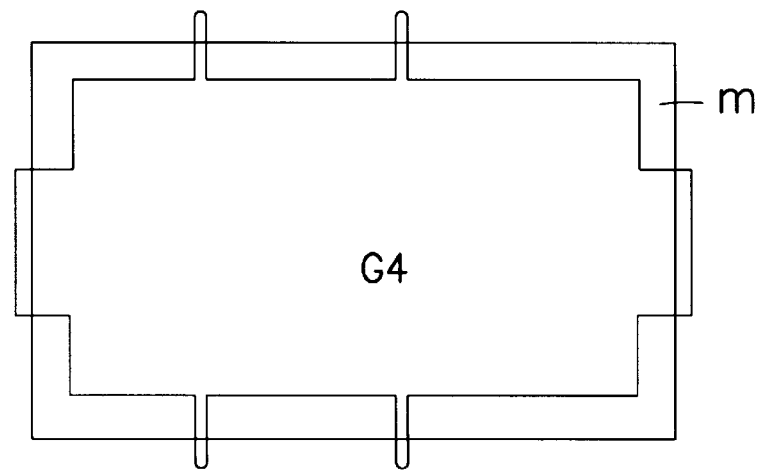
Figure 5F:
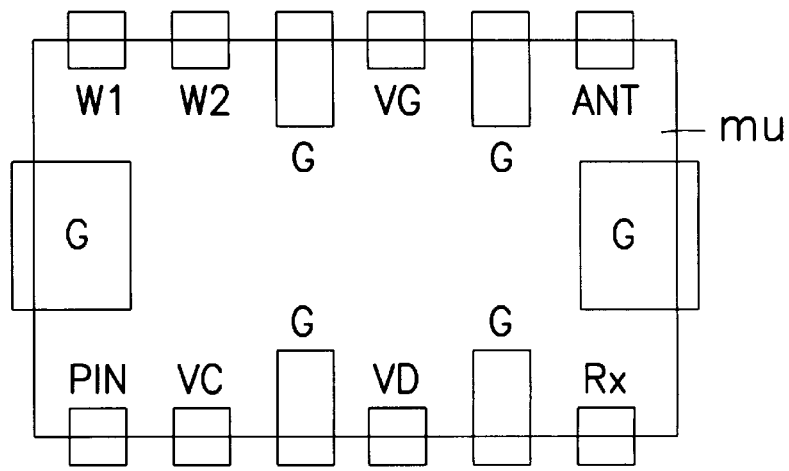

FIGS. 4A to 4H and FIGS. 5A to 5E are top views and FIGS. 5F is a bottom view of dielectric layers "a" to "m" constituting the high-frequency composite part 10 shown in FIG. 1. The high-frequency composite part 10 includes a multilayer board (not shown) in which the transmission lines and the capacitors used for the high-frequency switch SW shown in FIG. 2 and the amplifier AMP1 at the Tx side shown in FIG. 3 are built in. The multilayer board is formed, for example, by sequentially laminating a first to a thirteenth dielectric layers "a" to "m" made from low-temperature baked ceramic which has barium oxide, aluminum oxide, and silica as main components and which can be baked at a temperature of 850° C. to 1000° C.

At the upper surface of the first dielectric layer "a," lands R1 to R10 are formed for mounting the diodes D1 and D2 used for the high-frequency switch SW shown in FIG. 2 and FET Q1 and B-Tr Q2 used for the amplifier AMP1 at the Tx side shown in FIG. 3. On the upper surfaces of the second dielectric layer "b", and the fifth to the twelfth dielectric layers "e" to "l," capacitor electrodes C81, C31, C32, C11, C21, C51, C61, C71, and C41 are formed. On the upper surfaces of the second, the fourth, and the twelfth dielectric layers "b," "d," and "l," stripline electrodes SL4, SL1, SLL1, SLL2, SL2, and SL3 are formed.

On the upper surfaces of the third, the ninth, the eleventh, and the thirteenth dielectric layers "c," "i," "k," and "m," ground electrodes G1 to G4 are formed. On the lower surface (symbol "mu" is assigned in FIG. 5F) of the thirteenth dielectric layer "m," external terminals ANT, Tx, VV1, and VV2 connected to the second and the third ports P2 and P3 of the high-frequency switch SW and control terminals V1 and V2, respectively, external terminals PIN, VD, VG, and VC connected to the input port Pin of the amplifier AMP1 at the Tx side, the drain voltage terminal Vd, the gate voltage terminal Vg, and the collector voltage terminal Vc, respectively, and external electrodes G connected to the ground electrodes G1 to G4 are formed. The first port P1 of the high-frequency switch SW is connected to the output port $P_0$ of the amplifier AMP1 at the Tx side by a via hole inside the multilayer board.

The capacitors C1 and C2 of the high-frequency switch SW are formed of the capacitor electrode C11 and the ground electrode G3, and the capacitor electrode C21 and the ground electrode G3, respectively. The capacitors C3 to C8 of the amplifier AMP1 at the Tx side are formed of the capacitor electrode C31 and the capacitor electrode C32, the capacitor electrode C41 and the ground electrode G4, the capacitor electrode C51 and the ground electrode G3, the capacitor electrode C61 and the ground electrode G3, the capacitor electrode C71 and the ground electrode G3, and the capacitor electrode C81 and the ground electrode G1, respectively The transmission line STL1 in the high-frequency switch SW is formed of the stripline electrode SL1, the transmission line STL2 in the high-frequency switch SW is formed of the stripline electrode SL2, the transmission line STL3 in the amplifier AMP1 at the Tx side is formed of the stripline electrode SL3, the transmission line STL4 in the amplifier AMP1 at the Tx side is formed of the stripline electrode SL4, the inductor L1 in the amplifier AMP1 at the Tx side is formed of the stripline electrode SLL1, and the inductor L2 in the amplifier AMP1 at the Tx side is formed of the stripline electrode SLL2.

With the configuration described above, the multilayer board is formed in which the transmission lines SLT1 and SLT2 and the capacitors C1 and C2 used for the high-frequency switch SW shown in FIG. 2; and the transmission lines SLT3 and SLT4, the capacitors C3 to C8, and the inductors L1 and L2 all used for the amplifier AMP1 at the Tx side shown in FIG. 3, are built in. The diodes D1 and D2 used for the high-frequency switch SW shown in FIG. 2 and FET Q1 and B-Tr Q2 used for the amplifier AMP1 at the Tx side shown in FIG. 3 are mounted on the lands R1 to R10 of the multilayer board to complete the high-frequency composite part 10.

As described above, according to the high-frequency composite part of the first embodiment, since the transmission lines and the capacitors used for the high-frequency switch and the transmission lines, the capacitors, and the inductors used for the amplifier at the Tx side are formed within the multilayer board formed by laminating a plurality of dielectric layers; the diodes used for the high-frequency switch and FET and B-Tr used for the amplifier at the Tx side are mounted on the board, and all are integrated, the area required for mounting the high-frequency switch and the amplifier at the Tx side on a printed circuit board is reduced, as compared with a case in which conventional discrete high-frequency switch and amplifier at the Tx side are mounted on a printed circuit board and connected. The high-frequency composite part is made more compact and lightweight than conventional counterparts Manufacturing cost is also reduced.

In addition, since the high-frequency switch and the amplifier at the Tx side can be designed at the same time, impedance matching between the high-frequency switch and the amplifier at the Tx side is implemented at the design stage, and thereby a matching circuit becomes unnecessary.

Since the high-frequency switch and the amplifier at the Tx side are integrated and provided for the multilayer board, the length of a line connecting the high-frequency switch to the amplifier at the Tx side is reduced, whereby loss and current consumption become small. Therefore, a loss at the high-frequency composite part is also reduced.

In addition, because the multilayer board is made from low-temperature baked ceramic, a plurality of dielectric layers can be baked integrally with the electrodes forming the transmission lines and the capacitors on the plurality of dielectric layers. Therefore, a manufacturing process can be reduced and cost can also be reduced.

Figure 6:
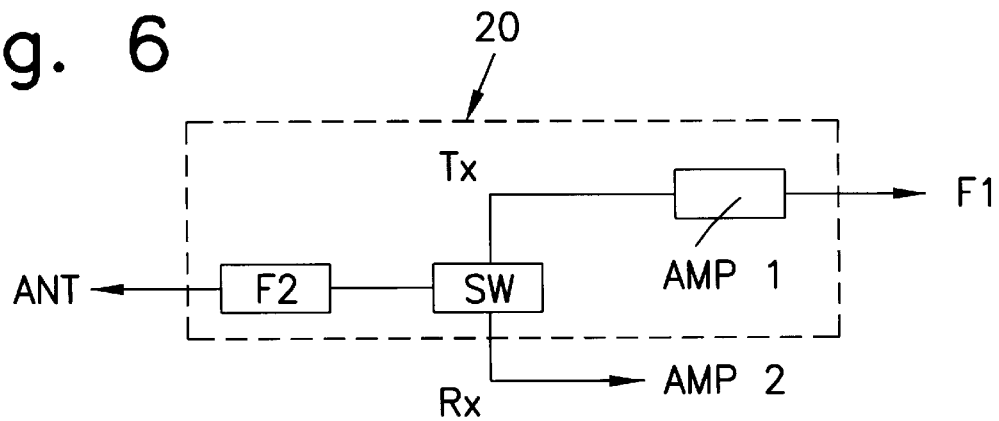
FIG. 6 is a block diagram of a high-frequency composite part according to a second embodiment of the present invention.
Figure 7:
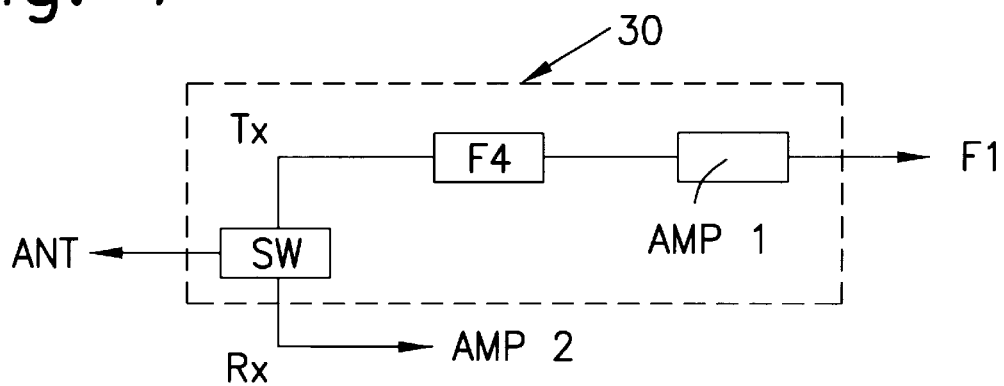
FIG. 7 is a block diagram of another high-frequency composite part according to a third embodiment of the present invention.

FIG. 6 and FIG. 7 are block diagrams of high-frequency composite parts according to a second and a third embodiment of the present invention, respectively. A high-frequency composite part 20 shown in FIG. 6 includes a high-frequency switch SW, an amplifier AMP1 in a Tx side, and a top filter F2 among the high-frequency parts constituting a PHS portable telephone shown in FIG. 11.

Figure 11:
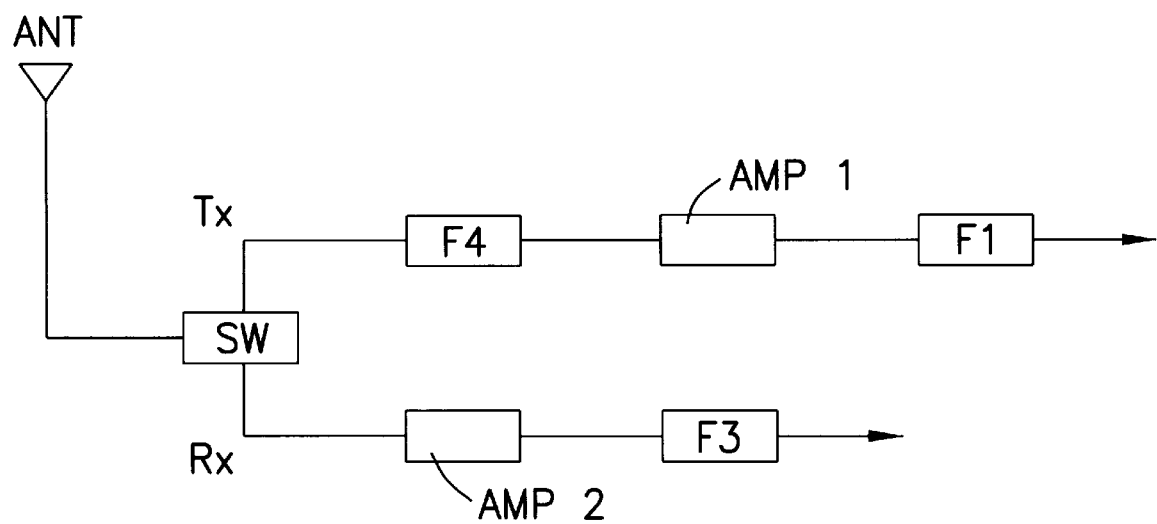
FIG. 11 is a block diagram of another known PHS portable telephone.

On the other hand, a high-frequency composite part 30 shown in FIG. 7 includes a high-frequency switch SW, an amplifier AMP1 in a Tx side, and a second filter F4 at the Tx side among the high-frequency parts constituting a PHS portable telephone shown in FIG. 11.

Figure 8:
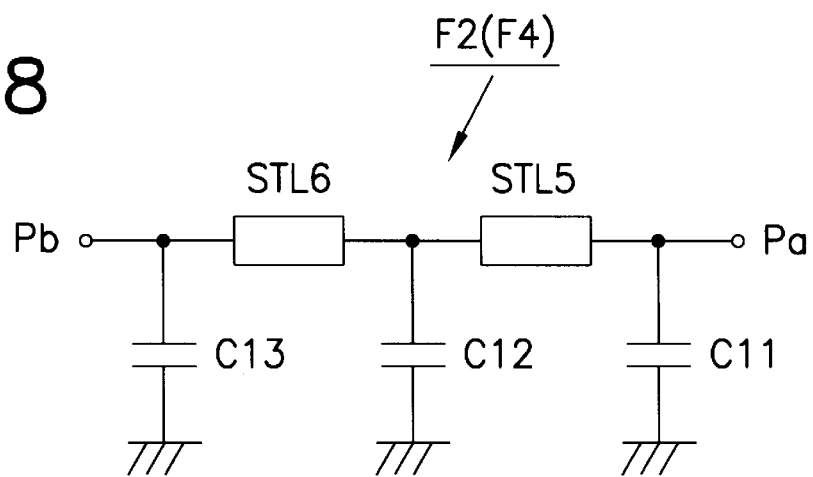
FIG. 8 is a circuit diagram of a filter used in the high-frequency composite part shown in FIGS. 4A–5F.

FIG. 8 is a circuit diagram of either the top filter F2 or the second filter F4 at the Tx side constituting the high-frequency composite parts shown in FIG. 6 and FIG. 7. The top filter F2 and the second filter F4 at the Tx side are Butterworth, low-pass, LC filters.

In the top filter F2 or the second filter F4 at the Tx side, transmission lines STL5 and STL6 are connected in series between one port Pa and the other port Pb. The connection point between the transmission line STL5 and one port Pa, the connection point between the transmission line STL5 and the transmission line STL6, and the connection point between the transmission line STL6 and the other port Pb are grounded through capacitors C11, C12, and C13, respectively.

At the top filter F2, port Pa is connected to the second port P2 of the high-frequency switch SW shown in FIG. 2, and port Pb is connected to the antenna ANT.

At the second filter F4 at the Tx side, port Pa is connected to the output port P0 of the amplifier AMP1 at the Tx side shown in FIG. 3, and port Pb is connected to the first port P1 of the high-frequency switch SW shown in FIG. 2.

As described above, according to the high-frequency composite parts of the second and third embodiments, since the high-frequency switch, the amplifier at the Tx side, and the top filter; or the high-frequency switch, the amplifier at the Tx side, and the second filter at the Tx side, are integrated in the multilayer board formed by laminating a plurality of dielectric layers, the composite part is made further compact and lightweight. Cost is further reduced.

In the above first, second and third embodiments, the amplifier at the Tx side is integrated into the high-frequency composite part. In other embodiments, an amplifier at the Rx side, or both an amplifier at the Tx side and amplifier at the Rx side, may all be integrated into a high-frequency composite part.

The circuit diagram of the high-frequency switch shown in FIG. 2 is just an example. The present invention can be applied more generally to any high-frequency switch formed of a diode mounted on a multilayer board, and a transmission line and a capacitor formed within the multilayer board.

Similarly, the circuit diagram of the amplifier shown in FIG. 3 is just an example. The present invention can be applied more broadly to any amplifier formed of a transistor mounted on a multilayer board, and a transmission line and a capacitor formed within the multilayer board.

In FIG. 3, the gate of FET Q1 is directly connected to the collector of B-Tr Q2. They may alternatively be connected through a capacitor. The connection point between the gate of FET Q1 and the collector of B-Tr Q2 is directly connected to the capacitor C6. The point may alternatively be connected to the capacitor through a resistor. The connection point between the inductor L2 and the capacitor C7 is directly connected to the connection point between the base of B-Tr Q2 and one end of the transmission line STL4. The points may alternatively be connected through a resistor.

A diode used for the high-frequency switch and a transistor used for the amplifier may be discrete or may alternatively be implemented by a monolithic microwave integrated circuit (MMIC) formed on the same semiconductor substrate.

In the above embodiments, low-temperature baked ceramic includes barium oxide, aluminum oxide, and silica as main components. A material including barium oxide, silica, strontium oxide, and zirconium oxide as main components, or a material having calcium oxide, zirconium oxide, and glass as main components may alternatively be used.

Figure 9:
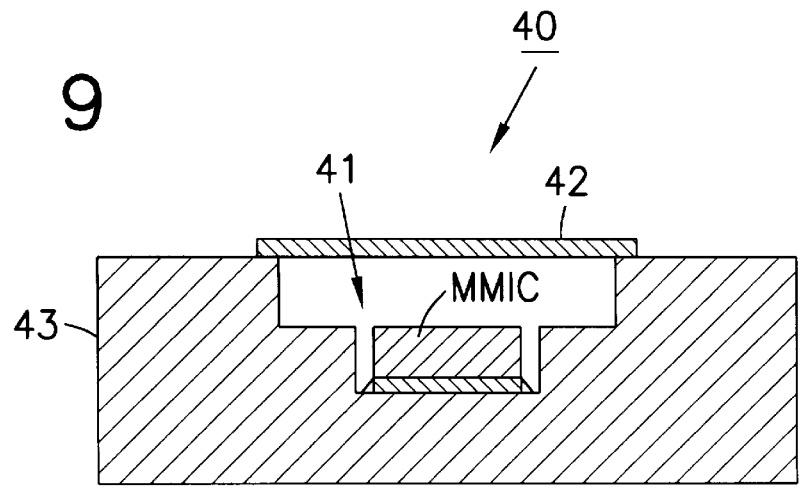
FIG. 9 is a cross-section of a modification of the high-frequency composite parts shown in FIGS. 1, 6, and 7.

As shown in FIG. 9, the high-frequency composite part 40 may alternatively be configured with a cavity 41 formed in the multilayer board 43. Either a diode used for the high-frequency switch and a transistor used for the amplifier, or an MMIC into which the diode and the transistor are integrated, is mounted in the cavity 41. When the opening of the cavity 41 is covered by a cap 42, the upper surface of the multilayer board 43 forming the high-frequency composite part 40 is made flat and is easily handled. In addition, other parts can be mounted thereon. The high-frequency composite part can be made further compact and lightweight.

In the above embodiments, the transmission lines STL1 to STL6 and the inductors L1 and L2 are formed of striplines. They may alternatively be formed of microstriplines or coplanar guide lines.

In the second and third embodiments, the top filter or the second filter at the Tx side is integrated as a filter into a high-frequency composite part. Alternatively, filters at the Rx side, filters at the Tx side, or both may be integrated.

The circuit diagram of the filter shown in FIG. 8 is just an example. The present invention can be applied more generally to any filter formed of a transmission line and a capacitor, both formed within a multilayer board.

What is claimed is:

1. A high-frequency composite part comprising:

a multilayer board formed by a laminating a plurality of dielectric layers;

a high-frequency switch comprising a diode mounted on said multilayer board, said diode being connected to a transmission line and a capacitor comprising interconnected electrodes formed on respective layers within said multilayer board; and an amplifier comprising a transistor mounted on the same said multilayer board, said transistor being connected to a transmission line and a capacitor comprising interconnected electrodes formed on respective layers within said same multilayer board;

wherein said interconnected electrodes of said high-frequency switch and said amplifier are integrally baked with said dielectric layers and connected to each other with in said multilayer board.

2. A high-frequency composite part according to claim 1, comprising a transmission circuit and a receiving circuit formed of interconnected electrodes formed on respective layers within said multilayer board, wherein said amplifier is comprised in said transmission circuit.

3. A high-frequency composite part according to claim 2, wherein said electrodes are connected directly to each other between said high-frequency switch and said amplifier.

4. A high-frequency composite part according to claim 2, further comprising a filter formed of a transmission line and a capacitor comprising interconnected electrodes formed on respective layers within said multilayer board.

5. A high-frequency composite part according to claim 4, wherein said multilayer board comprises low-temperature baked ceramic material.

6. A high-frequency composite part according to claim 4, wherein said electrodes are connected directly to each other between said high-frequency switch and said amplifier.

7. A high-frequency composite part according to claim 1, further comprising a filter formed of a transmission line and a capacitor comprising interconnected electrodes formed on respective layers within said multilayer board.

8. A high-frequency composite part according to claim 7, wherein said multilayer board comprises low-temperature baked ceramic material.

9. A high-frequency composite part according to claim 7, wherein said electrodes are connected directly to each other between said high-frequency switch and said amplifier.

10. A high-frequency composite part according to claim 1, wherein said multilayer board comprises low-temperature baked ceramic material.

11. A high-frequency composite part according to claim 1, wherein said electrodes are connected directly to each other between said high-frequency switch and said amplifier.

* * * * *